United States Patent
Lee et al.

(10) Patent No.: US 9,748,150 B2
(45) Date of Patent: Aug. 29, 2017

(54) TEST LINE STRUCTURE AND METHOD FOR PERFORMING WAFER ACCEPTANCE TEST

(71) Applicant: Taiwan Semiconductor Manufacturing Co., Ltd., Hsinchu (TW)

(72) Inventors: Yueh-Chuan Lee, Hsinchu (TW); Chia-Chan Chen, Zhubei (TW); Ping-Chieh Chin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/927,816

(22) Filed: Oct. 30, 2015

(65) Prior Publication Data
US 2017/0125309 A1     May 4, 2017

(51) Int. Cl.
*G01R 31/3187* (2006.01)
*H01L 21/66* (2006.01)
*G01R 31/28* (2006.01)

(52) U.S. Cl.
CPC .......... *H01L 22/14* (2013.01); *G01R 31/2884* (2013.01); *H01L 22/32* (2013.01); *H01L 22/34* (2013.01)

(58) Field of Classification Search
CPC .......... H01L 22/14; H01L 22/34; H01L 22/32; G01R 31/2884

USPC ...................... 324/750.3, 500, 537
See application file for complete search history.

(56) References Cited

U.S. PATENT DOCUMENTS

| | | | |
|---|---|---|---|
| 8,264,235 B2* | 9/2012 | De Vries | G01R 31/2884 324/525 |
| 2008/0073753 A1* | 3/2008 | Tsai | H01L 22/34 257/620 |
| 2008/0232181 A1* | 9/2008 | Higashi | G11C 7/1051 365/201 |
| 2013/0075725 A1* | 3/2013 | Huang | H01L 22/34 257/48 |
| 2013/0248863 A1* | 9/2013 | Tang | H01L 22/30 257/48 |
| 2017/0059645 A1* | 3/2017 | Pan | G01R 31/2607 |

* cited by examiner

*Primary Examiner* — Giovanni Astacio-Oquendo
(74) *Attorney, Agent, or Firm* — McClure, Qualey & Rodack, LLP

(57) ABSTRACT

Test line structures on a wafer are provided. A first testing pad is formed in a scribe line of the wafer. A second testing pad is formed in the scribe line. A transistor under test is formed in the scribe line and is coupled between the first testing pad and the second testing pad. A device is formed in the scribe line and is coupled between the first testing pad and the transistor under test. A third testing pad is formed in the scribe line and is coupled between the device and the transistor under test. A current passing through the transistor under test is measured via the second testing pad or the first testing pad when a first voltage is applied to the first testing pad, wherein the first voltage is determined according to a second voltage from the third testing pad.

20 Claims, 5 Drawing Sheets

TEST LINE STRUCTURE AND METHOD FOR PERFORMING WAFER ACCEPTANCE TEST

BACKGROUND

In the standard semiconductor process, in order to evaluate the efficiency of each procedure and to confirm the performance of the devices after the procedures, a wafer acceptance test (WAT) is performed on the wafers. The main purposes of the wafer acceptance test are to confirm the stability of the semiconductor process as well as to enhance the yield of devices. By means of the wafer acceptance test, the quality and the stability of the wafers are somewhat ensured.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
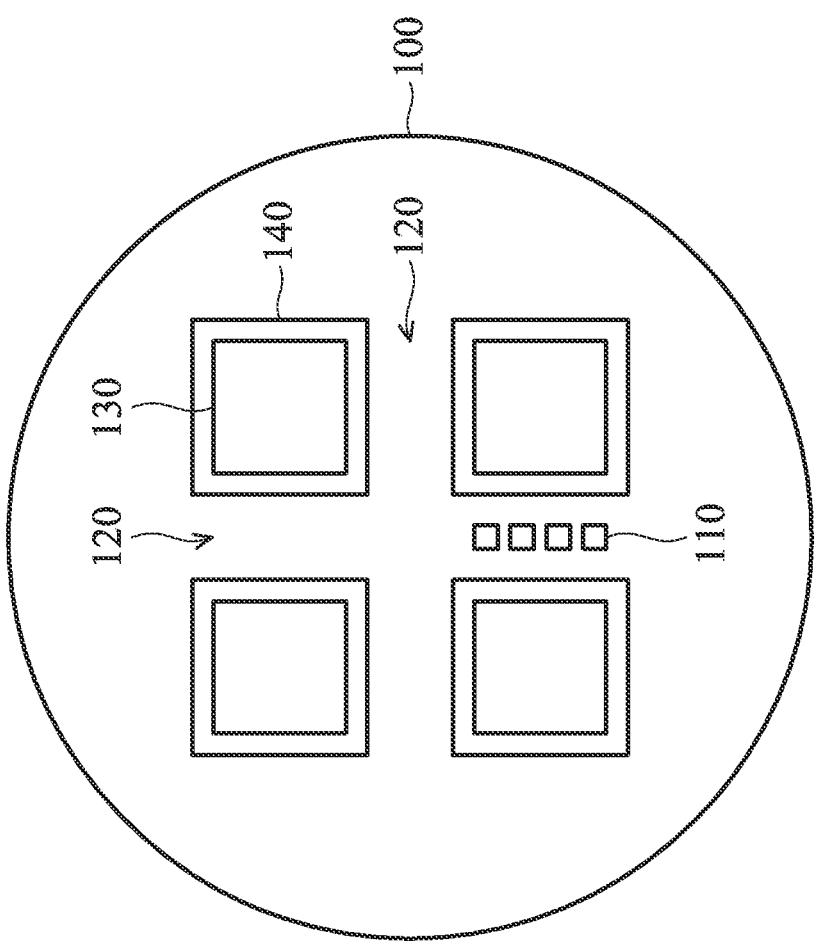
FIG. 1 shows a plan view of test line structures formed on a semiconductor wafer, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. In some embodiments, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

The manufacturing flow of the integrated circuit can be mainly divided into three stages, as follows: (1) the manufacturing of the semiconductor wafer, (2) the fabrication of the integrated circuit on the semiconductor wafer, and (3) the cutting, electric testing, sorting, and packaging of the integrated circuit. When fabricating the integrated circuit on the semiconductor wafer, the whole substrate is divided uniformly into many repetitive dies, and the adjacent dies are separated by scribe lines.

During semiconductor manufacturing process, the performance of a dielectric film should be evaluated by a wafer acceptance test (WAT) after the manufacturing process, in order to confirm the life time of the semiconductor device.

After the integrated circuit fabricating process on a semiconductor wafer is finished but before the wafer is cut into dies, a wafer acceptance test is conducted to derive the product yield. Prior to the wafer acceptance test, some test line structures (i.e. test keys and test pads) electrically connected thereto have been formed in the scribe lines around a die. The test line structures are electrically connected to an external circuit or probes of a probe card via the test pads to check the quality of the integrated circuit process in the wafer acceptance test. A device similar to a device formed in a die is also formed in the scribe line as a part of the test line structure.

The present disclosure is directed to a test line structure for wafer acceptance testing. The embodiments of the disclosure include the test line structure and testing methodology using the test line structure. This may also benefit other activities, such as yield analysis, design-of-experiment (DOE), statistical split, and customized user test key input, among others.

FIG. 1 shows a plan view of test line structures 110 formed on a semiconductor wafer 100, in accordance with some embodiments of the disclosure. The semiconductor wafer 100 includes a number of scribe line 120 between adjacent wafer dies 130. The test line structures 110 are formed in the scribe line 120, and the test line structures 110 can be used for tests or other functions, as discussed below. Each test line structure 110 includes one or more testing pads, such as wafer acceptance test array pads and optical critical dimension (OCD) pads. In the present embodiment, each die 130 includes a die seal ring 140 so that when the semiconductor wafer 100 is provided to assembly, each die is accordingly protected.

The scribe line 120 is formed on the exterior side of the dies 130 and the die seal rings 140 and surrounds the entire die seal ring 140. The die seal ring 140 are formed between the dies 130 and the scribe line 120, such that the die seal ring 140 could be used as a blocking wall for protecting the dies 130 from external stress while the semiconductor wafer is diced. The cutting operation is performed by using a cutter to cut the semiconductor wafer into individual dies along the scribe lines.

In order to evaluate the efficiency of each procedure and to confirm the performance of the devices after the procedures, a wafer acceptance test (WAT) is performed on the wafers. The wafer acceptance test includes electrical tests on the pads formed around the peripheral regions of the devices, e.g. the scribe line 120 of FIG. 1. The main purposes of the wafer acceptance test are to confirm the stability of the semiconductor process as well as to enhance the yield of devices. By means of the wafer acceptance test, the quality and the stability of the wafers are somewhat ensured.

Figure 2:
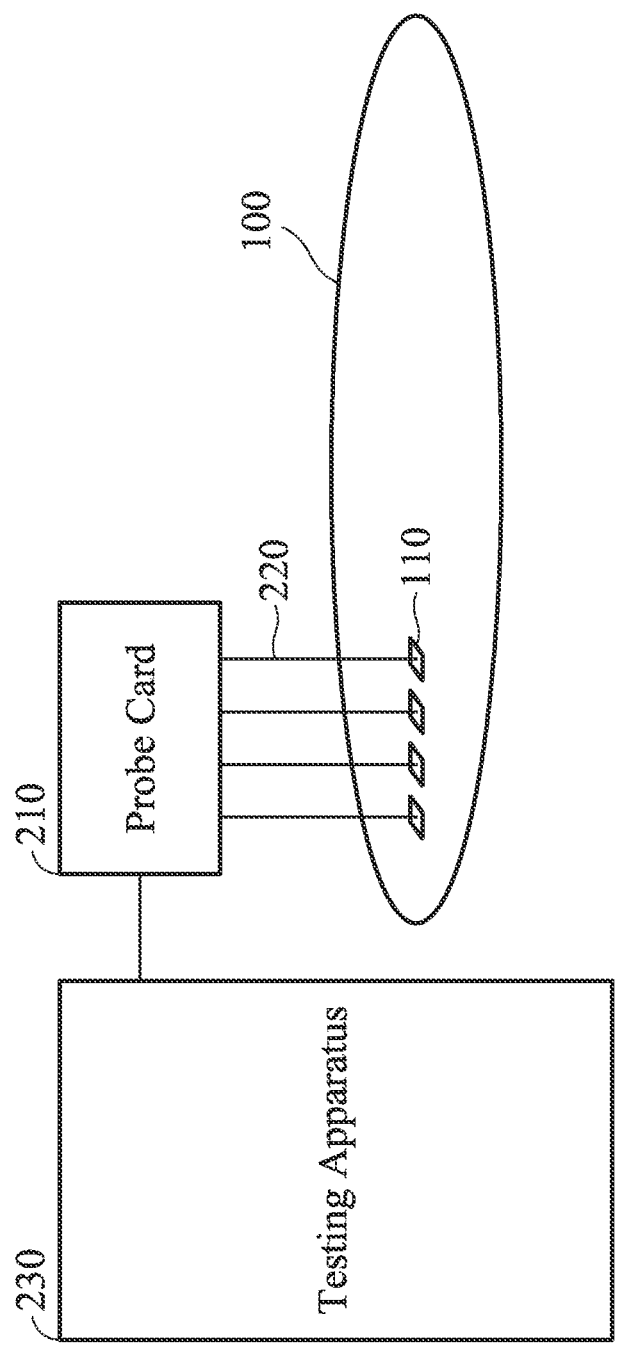
FIG. 2 shows an example illustrating a wafer acceptance test for a semiconductor wafer of FIG. 1, in accordance with some embodiments of the disclosure.

FIG. 2 shows an example illustrating a wafer acceptance test for a semiconductor wafer 100 of FIG. 1, in accordance with some embodiments of the disclosure. In FIG. 2, a probe card 210 is used to perform a wafer acceptance test. The probe card 210 includes a number of probes 220. It is understood that there are many types of probes 220, such as electrical probe pins, optical probes, and/or magnetic probes. The probes 220 of the probe card 210 are made contact with the test line structures 110, and the positions of the test pads of the test line structures 110 have to be identified first. After the probes 220 of the probe card 210 contact the test pads of the test line structures 110, the probe card 210 sequentially and repeatedly applies test signals to the test line structures 110 through the probes 220, and then receives responses from the test line structures 110 through the probes 220. The probe card 210 is usually connected to a testing apparatus (tester) 230, and the testing apparatus 230 can perform various test programs and record the test results of the semiconductor wafer 200. In a Back End of Line (BEOL) test, the test line structures 110 can provide process stability on various parameters. Upon finishing the tests, failed dies are inked and/or faulty process results are identified via the testing apparatus 230. The semiconductor wafer 100 is then diced along the scribe lines 120. Therefore, integrated circuit devices (chips) are created.

In some embodiments, the semiconductor wafer 100 uses a copper metal structure for interconnecting circuitry on the various wafer dies 16. The copper metal structure includes a number of metal layers, e.g., five, separated by one or more layers of interlayer dielectric. For each layer, a dielectric layer is etched with a pattern, copper is deposited over the patterned dielectric layer, and a top portion of the deposited copper is removed by a chemical mechanical planarization (CMP) process. The overall process can be used to not only make the metal interconnects, but a dual damascene process can be used to make vias and other interlayer connections. It is understood that the various layers can be of other materials, such as copper alloy and/or aluminum.

In some embodiments, it is desired that the thickness and width of the copper interconnects be of the proper size to insure such things as reliability and a proper sheet resistance. Therefore, the test line structures 110 can provide structures by which these measurements can be made outside of the die.

Figure 3:
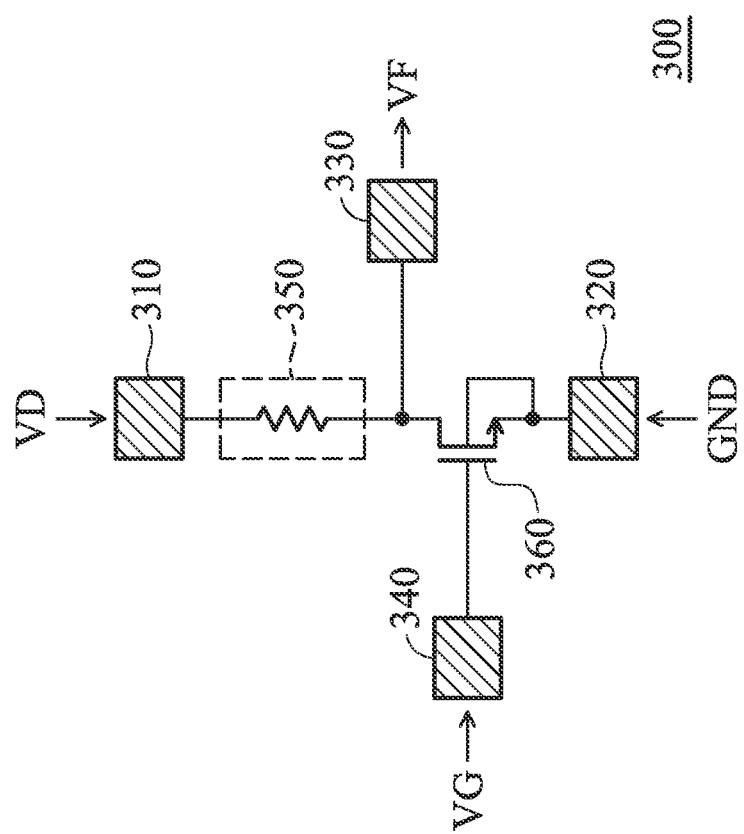
FIG. 3 shows a test line structure, in accordance with some embodiments of the disclosure.

FIG. 3 shows a test line structure 300, in accordance with some embodiments of the disclosure. The test line structure 300 is implemented in a scribe line of a semiconductor wafer, and the test line structure 300 includes a testing pad 310, a testing pad 320, a testing pad 330, a testing pad 340, a device 350, and a transistor under test 360.

The testing pad 310 is coupled to the device 350, and the device 350 is coupled between the testing pad 310 and the testing pad 330. The transistor under test 360 is coupled between the testing pad 330 and the testing pad 320.

In the present embodiment, the transistor under test 360 is an NMOS transistor. The testing pad 330 is coupled to a drain of the transistor under test 360. The testing pad 320 is coupled to a source of the transistor under test 360. The testing pad 340 is coupled to a gate of the transistor under test 360. Furthermore, the testing pad 320 is also coupled to a bulk of the transistor under test 360.

In some embodiments, the transistor under test 360 may be a PMOS transistor. The testing apparatus will provide the corresponding voltages to the testing pad 310, the testing pad 320, and the testing pad 340 for the PMOS transistor.

In some embodiments, the transistor under test 360 may be other active devices for which the small signal model is not passive are called active (e.g. transistors and tunnel diodes).

In a wafer acceptance test, a testing apparatus (e.g. 230 of FIG. 2) uses a probe card (e.g. 210 of FIG. 2) to test the test line structure 300. In the present embodiment, a first probe of the probe card is used to contact the testing pad 310 of the test line structure 300. A second probe of the probe card is used to contact the testing pad 320 of the test line structure 300. A third probe of the probe card is used to contact the testing pad 330 of the test line structure 300. A fourth probe of the probe card is used to contact the testing pad 340 of the test line structure 300.

The testing apparatus provides a voltage VD to the testing pad 310 via the first probe of the probe card. Furthermore, the testing apparatus provides a voltage VG to the testing pad 340 via the fourth probe of the probe card. Moreover, the testing apparatus grounds the testing pad 320 (GND) via the second probe of the probe card.

It should be noted that when the voltage VD is applied to the testing pad 310, the voltage VG is applied to the testing pad 340, and the testing pad 320 is grounded, the testing apparatus measures a voltage VF from the testing pad 330 via the third probe of the probe card.

After obtaining the voltage VF of the testing pad 330, the testing apparatus adjusts the voltage VD according to the obtained voltage VF of the testing pad 330. In the present embodiment, according to the obtained voltage VF of the testing pad 330, the testing apparatus can obtain a voltage difference between the voltage VD applied to the testing pad 310 and the voltage VF obtained from the testing pad 330.

According to the voltage difference between the voltage VD applied to the testing pad 310 and the voltage VF obtained from the testing pad 330, the testing apparatus can determine that the voltage difference is caused by a voltage drop of the device 350.

Therefore, the testing apparatus can adjust the voltage VD according to the voltage difference. In some embodiments, the testing apparatus increases the voltage difference to the voltage VD, and the increased voltage VD is higher than original voltage VD. After the increased voltage VD is applied to the testing pad 310, the testing apparatus re-measures the voltage VF from the testing pad 330 via the third probe of the probe card.

If the re-measured voltage VF does not reaches a predetermined value, the testing apparatus will adjust the voltage VD again according to a voltage difference between the increased voltage VD applied to the testing pad 310 and the re-measured voltage VF obtained from the testing pad 330 until the received voltage VF reaches a predetermined value.

In some embodiments, the device 350 is a trace in the scribe line, and the trace has a parasitic resistance. In some embodiments, the device 350 is a switch, and the turned on switch has a parasitic resistance.

By compensating the voltage drop caused by parasitic resistance, an appropriate drain voltage is generated and applied to the transistor under test 360. Therefore, high accuracy of a wafer acceptance test measurement is obtained, and offset value caused by the parasitic resistance is removed.

When the received voltage VF reaches a predetermined value, the testing apparatus can measure the different functions of the transistor under test 360, such as starting voltage (threshold voltage, Vt) and saturated current (saturate current, Isat) and the like. In the present embodiment, the testing apparatus can obtain a current passing through the transistor under test 360 via the testing pad 310 and testing pad 320. According to the current passing through the transistor under test 360 and the received voltage VF corresponding to the current passing through the transistor under test 360, the testing apparatus can obtain information of the transistor under test 360, e.g. the threshold voltage (Vt) and/or the saturate current (Isat).

The accuracy of the wafer acceptance test will affect the quality of the semiconductor device. In some embodiments, if an error bar of the wafer acceptance test is large, the life time of the semiconductor device cannot be precisely predicted.

By measuring the voltage VF of the testing pad 330, the voltage VD applied to the testing pad 310 is adjusted according to the measured voltage VF, thereby the voltage drop caused by the device 350 is compensated. Therefore, the accuracy of the wafer acceptance test is increased.

Figure 4:
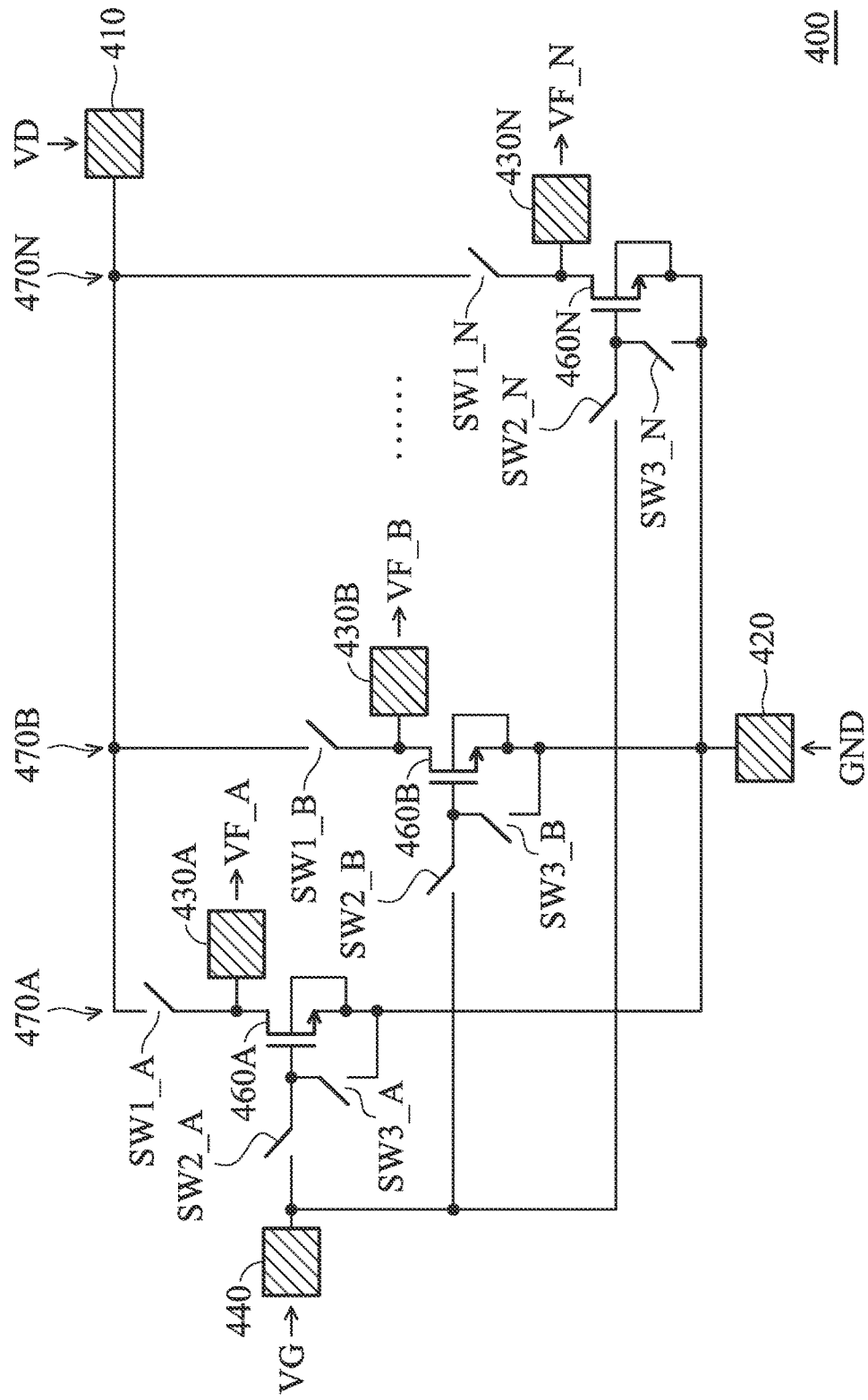
FIG. 4 shows a matrix test line structure, in accordance with some embodiments of the disclosure.

FIG. 4 shows a matrix test line structure 400, in accordance with some embodiments of the disclosure. The matrix test line structure 400 is implemented in a scribe line of a semiconductor wafer, and the matrix test line structure 400 includes a number of test line structures 470A, 470B, . . . , 470N, a testing pad 410, a testing pad 420, and a testing pad 440.

In the present embodiment, the test line structure 470A includes a switch SW1_A, a testing pad 430A, a transistor under test 460A, a switch SW2_A, and a switch SW3_A. The switch SW1_A is coupled between the testing pad 410 and the testing pad 430A. The transistor under test 460A is coupled between the testing pad 430A and the testing pad 420.

In the present embodiment, the transistor under test 460A is an NMOS transistor. The testing pad 430A is coupled to a drain of the transistor under test 460A. The testing pad 420 is coupled to a source of the transistor under test 460A. Furthermore, the testing pad 420 is also coupled to a bulk of the transistor under test 460A. The switch SW2_A is coupled between a gate of the transistor under test 460A and the testing pad 440. The switch SW3_A is coupled between the gate of the transistor under test 460A and the testing pad 420.

In the present embodiment, the test line structure 470B includes a switch SW1_B, a testing pad 430B, a transistor under test 460B, a switch SW2_B, and a switch SW3_B. The switch SW1_B is coupled between the testing pad 410 and the testing pad 430B. The transistor under test 460B is coupled between the testing pad 430B and the testing pad 420.

In the present embodiment, the transistor under test 460B is an NMOS transistor. The testing pad 430B is coupled to a drain of the transistor under test 460B. The testing pad 420 is coupled to a source of the transistor under test 460B. Furthermore, the testing pad 420 is also coupled to a bulk of the transistor under test 460B. The switch SW2_B is coupled between a gate of the transistor under test 460B and the testing pad 440. The switch SW3_B is coupled between the gate of the transistor under test 460B and the testing pad 420.

In the present embodiment, the test line structure 470N includes a switch SW1_N, a testing pad 430N, a transistor under test 460N, a switch SW2_N, and a switch SW3_N. The switch SW1_N is coupled between the testing pad 410 and the testing pad 430N. The transistor under test 460N is coupled between the testing pad 430N and the testing pad 420.

In the present embodiment, the transistor under test 460N is an NMOS transistor. The testing pad 430N is coupled to a drain of the transistor under test 460N. The testing pad 420 is coupled to a source of the transistor under test 460N. Furthermore, the testing pad 420 is also coupled to a bulk of the transistor under test 460N. The switch SW2_N is coupled between a gate of the transistor under test 460N and the testing pad 440. The switch SW3_N is coupled between the gate of the transistor under test 460N and the testing pad 420.

In the present embodiment, the sizes of the transistors under test 460A-460N are different. In some embodiments, the size of the transistor under test 460A is W1/L1, the size of the transistor under test 460B is W2/L2, and the size of the transistor under test 460N is Wn/Ln.

In some embodiments, the transistor under test 460A-460N may be the PMOS transistors. The testing apparatus will provide the corresponding voltages to the testing pad 410, the testing pad 420, and the testing pad 440 for the PMOS transistors.

Similarly, the sizes of the PMOS transistors under test are different.

In some embodiments, the transistors under test 460A-460N may be other active devices for which the small signal model is not passive are called active (e.g. transistors and tunnel diodes).

In a wafer acceptance test, a testing apparatus (e.g. 230 of FIG. 2) uses a probe card (e.g. 210 of FIG. 2) to test the matrix test line structure 400. In the present embodiment, a first probe of the probe card is used to contact the testing pad 410 of the matrix test line structure 400. A second probe of the probe card is used to contact the testing pad 420 of the matrix test line structure 400. A fourth probe of the probe card is used to contact the testing pad 440 of the matrix test line structure 400.

First, the testing apparatus determines which test line structure of the matrix test line structure 400 to be measured. Assuming that the testing apparatus determines to measure the test line structure 470A, the testing apparatus uses a fifth probe of the probe card to provide a control signal. The control signal can control some simple circuits formed in the scribe line, to turn on the switch SW1_A, and the switch SW2_A, and to turn off the switch SW3_A.

Simultaneously, the switch SW1_B and the switch SW2_B of the test line structure 470B, the switch SW1_N and the switch SW2_N of the test line structure 470N are turned off by the control signal. The switch SW3_B of the test line structure 470B, the switch SW3_N of the test line structure 470N are turned on by the control signal. Therefore, the transistors under test 460B-460N are turned off by the control signal.

In the matrix test line structure 400, the testing apparatus provides a voltage VD to the testing pad 410 via the first probe of the probe card. Furthermore, the testing apparatus provides a voltage VG to the testing pad 440 via the fourth probe of the probe card. Moreover, the testing apparatus grounds the testing pad 420 (GND) via the second probe of the probe card.

In the test line structure 470A, the switch SW1_A and the switch SW2_A are turned on, and the voltage VD can apply to the drain of the transistor under test 460A via the switch SW1_A, and the voltage VG can apply to the gate of the transistor under test 460A via the switch SW2_A.

In the present embodiment, a third probe of the probe card is used to contact the testing pad 430A of the test line structure 470A. The testing apparatus measures a voltage VF_A from the testing pad 430A via the third probe of the probe card.

After obtaining the voltage VF_A of the testing pad 430A, the testing apparatus adjusts the voltage VD according to the obtained voltage VF_A of the testing pad 430A. In the present embodiment, according to the obtained voltage VF_A of the testing pad 430A, the testing apparatus can obtain a voltage difference between the voltage VD applied to the testing pad 410 and the voltage VF_A obtained from the testing pad 430A of the test line structure 470A.

According to the voltage difference between the voltage VD applied to the testing pad 410 and the voltage VF_A obtained from the testing pad 430A of the test line structure 470A, the testing apparatus can determine that the voltage difference is caused by a voltage drop of the switch SW1_A.

Therefore, the testing apparatus can adjust the voltage VD according to the voltage difference. In some embodiments, the testing apparatus increases the voltage difference to the voltage VD, and the increased voltage VD is higher than original voltage VD. After the increased voltage VD is applied to the testing pad 410, the testing apparatus re-measures the voltage VF_A from the testing pad 430A of the test line structure 470A via the third probe of the probe card.

If the re-measured voltage VF_A does not reaches a predetermined value, the testing apparatus will adjust the voltage VD again according to a voltage difference between the increased voltage VD applied to the testing pad 410 and the re-measured voltage VF_A obtained from the testing pad 430A of the test line structure 470A until the received voltage VF_A reaches a predetermined value corresponding to the transistor under test 460A.

By compensating the voltage drop caused by parasitic resistance of the switch SW1_A, an appropriate drain voltage is generated and applied to the transistor under test 460A. Therefore, high accuracy of a wafer acceptance test measurement is obtained, and offset value caused by the parasitic resistance is removed.

When the received voltage VF_A reaches a predetermined value, the testing apparatus can measure the different functions of the transistor under test 460A, such as starting voltage (threshold voltage, Vt) and saturated current (saturate current, Isat) and the like. In the present embodiment, the testing apparatus can obtain a current passing through the transistor under test 460A via the testing pad 410 and testing pad 420. According to the current passing through the transistor under test 460A and the received voltage VF_A corresponding to the current passing through the transistor under test 460A, the testing apparatus can obtain information of the transistor under test 460A, e.g. the threshold voltage (Vt) and/or the saturate current (Isat).

Similarly, if the testing apparatus determines to measure another test line structure (e.g. 470N), the testing apparatus uses the fifth probe of the probe card to provide the control signal, so as to turn on the switch SW1_N, and the switch SW2_N, and to turn off the switch SW3_N.

Simultaneously, the switch SW1_A and the switch SW2_A of the test line structure 470A, the switch SW1_B and the switch SW2_B of the test line structure 470B are turned off by the control signal. The switch SW3_A of the test line structure 470A, the switch SW3_B of the test line structure 470B are turned on by the control signal. Therefore, the transistors under test 460A-460(N−1) are turned off by the control signal.

As described above, the third probe of the probe card is used to contact the testing pad 430N of the test line structure 470N. The testing apparatus measures a voltage VF_N from the testing pad 430N via the third probe of the probe card.

After obtaining the voltage VF_N of the testing pad 430N, the testing apparatus adjusts the voltage VD according to the obtained voltage VF_N of the testing pad 430N. The testing apparatus can adjust the voltage VD according to a voltage difference between the voltage VD applied to the testing pad 410 and the voltage VF_N obtained from the testing pad 430N of the test line structure 470N until the received voltage VF_N reaches a predetermined value corresponding to the transistor under test 460N.

The accuracy of the wafer acceptance test will affect the quality of the semiconductor device. In some embodiments, if an error bar of the wafer acceptance test is large, the life time of the semiconductor device cannot be precisely predicted.

By measuring the voltage VF_A of the testing pad 430A, the voltage VF_B of the testing pad 430B, and the voltage VF_N of the testing pad 430N, respectively, the voltage VD applied to the testing pad 410 is adjusted according to the corresponding measured voltage (e.g. VF_A, VF_B, . . . , or VF_N), thereby the voltage drop caused by the corresponding switch (e.g. SW1_A, SW1_B, . . . , or SW1_N) is compensated. Therefore, the accuracy of the wafer acceptance test is increased.

Figure 5:
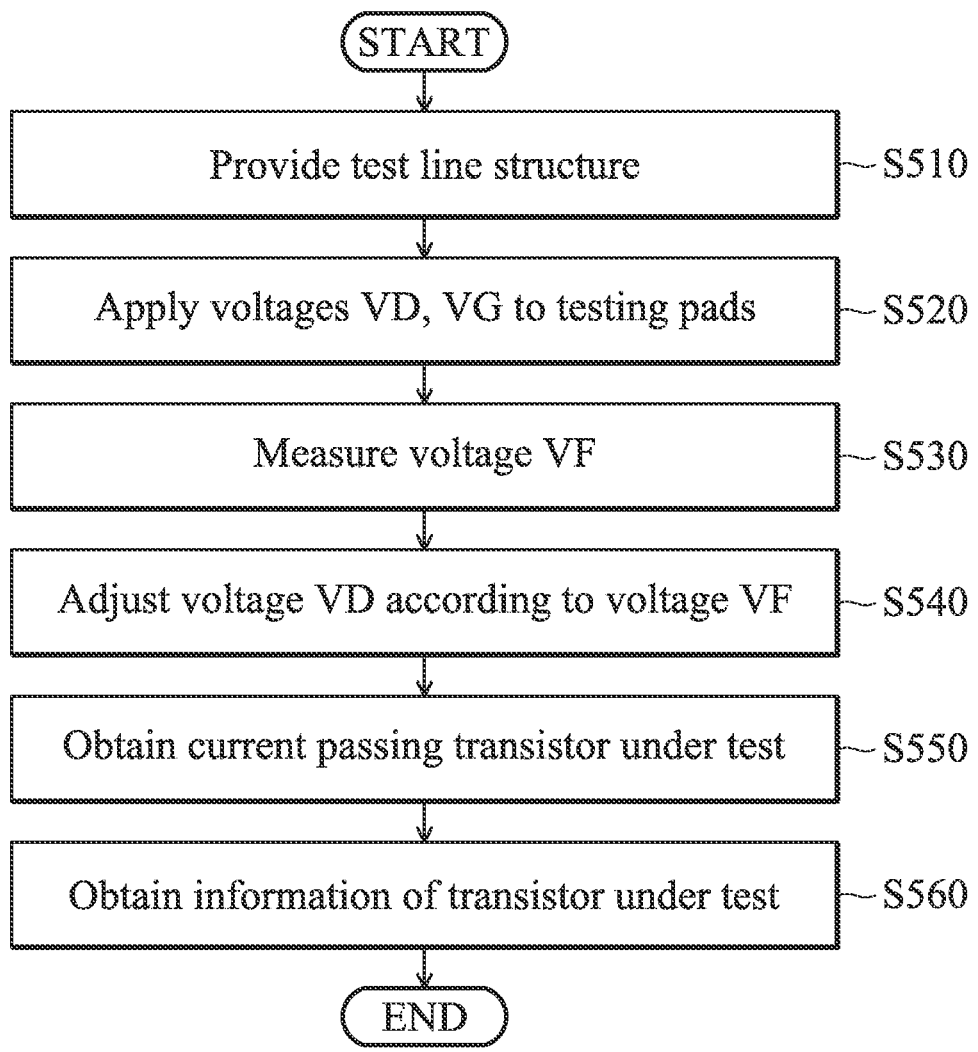
FIG. 5 shows a method for performing a wafer acceptance test, in accordance with some embodiments of the disclosure.

FIG. 5 shows a method for performing a wafer acceptance test, in accordance with some embodiments of the disclosure. First, in operation S510, a test line structure formed in a scribe line of a wafer is provided. The test line structure includes a first testing pad (e.g. 310 of FIG. 3, or 410 of FIG. 4), a second testing pad (e.g. 320 of FIG. 3, or 420 of FIG. 4), a transistor under test (e.g. 360 of FIG. 3, or 460A-460N of FIG. 4) coupled between the first testing pad and the second testing pad, a device (e.g. 350 of FIG. 3 or switches SW1_A-SW1_N of FIG. 4) coupled between the first testing pad and the transistor under test, a third testing pad (e.g. 330 of FIG. 3, or 430A-430N of FIG. 4) coupled between the device and the transistor under test, and a fourth testing pad (e.g. 340 of FIG. 3 or 440 of FIG. 4) coupled to a gate of the transistor under test.

In operation S520, a voltage VD is applied to the first testing pad, a voltage VG is applied to the fourth testing pad, and a ground signal is applied to the second testing pad, by a testing apparatus via the probes of a probe card.

In operation S530, a voltage VF is measured from the third testing pad by the testing apparatus via the probe of the probe card.

In operation S540, the testing apparatus adjusts a voltage level of the voltage VD according to the received voltage VF until the received voltage VF reaches a predetermined value. The predetermined value is determined according to the type, the size, and the process of the transistor under test.

In operation S550, the testing apparatus obtains a current passing through the transistor under test when the received voltage VF reaches the predetermined value.

In operation S560, according to the current passing through the transistor under test and the received voltage VF, the testing apparatus can obtain information of the transistor under test in the test line structure, e.g. the threshold voltage (Vt) and/or the saturate current (Isat).

Therefore, according to the information of the transistor under test, the testing apparatus can determine whether the test line structure is normal.

In some embodiments, the testing apparatus can determine whether the test line structure is normal according to the current passing through the transistor under test and the received voltage VF.

In some embodiments, the information of the transistor under test is analyzed, so as to analyze the manufacturing process of the semiconductor wafer.

Embodiments for improving accuracy of wafer acceptance test are provided. An additional testing pad is used to measure a drain voltage of the transistor under test. According to the measured voltage, the testing apparatus can adjust the voltage VD, so as to remove the voltage drop caused by a parasitic resistance. The parasitic resistance may be provided by a switch or a trace coupled to the transistor under test in the scribe line. By compensating the voltage drop caused by parasitic resistance, an appropriate drain voltage is generated and applied to the transistor under test. Therefore, high accuracy of a wafer acceptance test measurement is obtained, and offset value caused by the parasitic resistance is removed.

In some embodiments, a test line structure on a wafer is provided. The test line structure includes a first testing pad formed in a scribe line of the wafer, a second testing pad formed in the scribe line, a transistor under test formed in the scribe line and coupled between the first testing pad and the second testing pad, a device formed in the scribe line and coupled between the first testing pad and the transistor under test, and a third testing pad formed in the scribe line and coupled between the device and the transistor under test. A current passing through the transistor under test is measured via the second testing pad when a first voltage is applied to the first testing pad, wherein the first voltage is determined according to a second voltage from the third testing pad.

In some embodiments, a method for performing a wafer acceptance test is provided. A test line structure formed in a scribe line of a wafer is provided. The test line structure includes a first testing pad, a second testing pad, a transistor under test coupled between the first testing pad and the second testing pad, a device coupled between the first testing pad and the transistor under test, and a third testing pad coupled between the device and the transistor under test. A current passing through the transistor under test is obtained via the second testing pad when a first voltage is applied to the first testing pad, wherein the first voltage is determined according to a second voltage from the third testing pad. It is determined whether the test line structure is normal according to the obtained current and the second voltage from the third testing pad.

In some embodiments, a matrix test line structure on a wafer is provided. The matrix test line structure includes a first testing pad formed in a scribe line of the wafer, a second testing pad formed in the scribe line, a number of test line structures formed in the scribe line. Each of the test line structures comprises a transistor under test coupled between the first testing pad and the second testing pad, a first switch formed coupled between the first testing pad and the transistor under test, and a third testing pad coupled between the first switch and the transistor under test. One of the first switches is turned on and the other of the first switches are turned off, and in the test line structure corresponding to the turned on first switch, a current passing through the transistor under test is measured via the second testing pad when a first voltage is applied to the first testing pad, wherein the first voltage is determined according to a second voltage from the third testing pad of the test line structure corresponding to the turned on first switch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A test line structure on a wafer, comprising:
    a first testing pad formed in a scribe line of the wafer;
    a second testing pad formed in the scribe line;
    a transistor under test formed in the scribe line and coupled between the first testing pad and the second testing pad;
    a device formed in the scribe line and coupled between the first testing pad and the transistor under test; and
    a third testing pad formed in the scribe line and coupled between the device and the transistor under test,
    wherein a current passing through the transistor under test is measured via the second testing pad or the first testing pad when a first voltage is applied to the first testing pad, wherein the first voltage is determined according to a second voltage from the third testing pad.

2. The test line structure as claimed in claim 1, wherein the device is a trace in the scribe line, and the trace has a parasitic resistance.

3. The test line structure as claimed in claim 1, wherein the device is a first switch, and the current passing through the transistor under test is measured when the first switch is turned on.

4. The test line structure as claimed in claim 3, further comprising:
    a fourth testing pad formed in the scribe line for having a third voltage applied;
    a second switch formed in the scribe line and coupled between the fourth testing pad and a gate of the transistor under test; and
    a third switch formed in the scribe line and coupled between the second testing pad and the gate of the transistor under test.

5. The test line structure as claimed in claim 4, wherein the current passing through the transistor under test is measured when the first switch and the second switch are turned on and the third switch is turned off.

6. The test line structure as claimed in claim 1, wherein the first voltage is provided by a testing apparatus, and the testing apparatus receives the second voltage from the third testing pad and adjusts a voltage level of the first voltage according to the received second voltage until the received second voltage reaches a predetermined value.

7. The test line structure as claimed in claim 6, wherein the testing apparatus adjusts the voltage level of the first voltage according to a voltage difference between the first voltage and the received second voltage.

8. A method for performing a wafer acceptance test, comprising:
    providing a test line structure formed in a scribe line of a wafer, wherein the test line structure comprises:
        a first testing pad;
        a second testing pad;
        a transistor under test coupled between the first testing pad and the second testing pad;
        a device coupled between the first testing pad and the transistor under test; and
        a third testing pad coupled between the device and the transistor under test;
    obtaining a current passing through the transistor under test via the second testing pad or the first testing pad when a first voltage is applied to the first testing pad, wherein the first voltage is determined according to a second voltage from the third testing pad; and obtaining information of the transistor under test according to the obtained current and the second voltage from the third testing pad.

9. The method as claimed in claim 8, wherein the device is a trace in the scribe line, and the trace has a parasitic resistance.

10. The method as claimed in claim 8, wherein the device is a first switch, and obtaining the current passing through the transistor under test via the second testing pad when the first voltage is applied to the first testing pad further comprises:
   turning on the first switch.

11. The method as claimed in claim 10, wherein the test line structure further comprises:
   a fourth testing pad formed in the scribe line for being supplied with a third voltage;
   a second switch formed in the scribe line and coupled between the fourth testing pad and a gate of the transistor under test; and
   a third switch formed in the scribe line and coupled between the second testing pad and the gate of the transistor under test.

12. The method as claimed in claim 11, wherein obtaining the current passing through the transistor under test via the second testing pad when the first voltage is applied to the first testing pad further comprises:
   turning on the first switch and the second switch; and
   turning off the third switch.

13. The method as claimed in claim 8, wherein obtaining the current passing through the transistor under test via the second testing pad when the first voltage is applied to the first testing pad further comprises:
   providing the first voltage by a testing apparatus;
   receiving the second voltage from the third testing pad;
   adjusting a voltage level of the first voltage according to the received second voltage until the received second voltage reaches a predetermined value; and
   obtaining the current passing through the transistor under test when the received second voltage reaches the predetermined value.

14. The method as claimed in claim 13, wherein adjusting the voltage level of the first voltage according to the received second voltage until the received second voltage reaches a predetermined value further comprises:
   adjusting the voltage level of the first voltage according to a voltage difference between the first voltage and the received second voltage.

15. A matrix test line structure on a wafer, comprising:
   a first testing pad formed in a scribe line of the wafer;
   a second testing pad formed in the scribe line; and
   a number of test line structures formed in the scribe line, wherein each of the test line structures comprises:
   a transistor under test coupled between the first testing pad and the second testing pad;
   a first switch formed coupled between the first testing pad and the transistor under test; and
   a third testing pad coupled between the first switch and the transistor under test,
   wherein one of the first switches is turned on and the other of the first switches are turned off, and in the test line structure corresponding to the turned on first switch, a current passing through the transistor under test is measured via the second testing pad or the first testing pad when a first voltage is applied to the first testing pad, wherein the first voltage is determined according to a second voltage from the third testing pad of the test line structure corresponding to the turned on first switch.

16. The matrix test line structure as claimed in claim 15, further comprising:
   a fourth testing pad formed in the scribe line for having a third voltage applied;
   wherein each of the test line structure further comprises:
   a second switch coupled between the fourth testing pad and a gate of the transistor under test; and
   a third switch coupled between the second testing pad and the gate of the transistor under test.

17. The matrix test line structure as claimed in claim 16, wherein in the test line structure corresponding to the turned on first switch, the current passing through the transistor under test is measured when the first switch and the second switch are turned on and the third switch is turned off.

18. The matrix test line structure as claimed in claim 17, wherein in the test line structure corresponding to the turned off first switch, the first switch and the second switch are turned off and the third switch is turned on.

19. The matrix test line structure as claimed in claim 15, wherein the first voltage is provided by a testing apparatus, and the testing apparatus receives the second voltage from the third testing pad in the test line structure corresponding to the turned on first switch, and the testing apparatus adjusts a voltage level of the first voltage according to the received second voltage until the received second voltage reaches a predetermined value.

20. The matrix test line structure as claimed in claim 19, wherein the testing apparatus adjusts the voltage level of the first voltage according to a voltage difference between the first voltage and the received second voltage.

* * * * *